United States Patent [19]
Park

[11] Patent Number: 6,060,916
[45] Date of Patent: May 9, 2000

[54] OPERATION CONTROLLER FOR A SEMICONDUCTOR MEMORY DEVICE

[75] Inventor: Chan-seok Park, Kyungki-do, Rep. of Korea

[73] Assignee: Samsung Electronics, Co., Ltd., Suwon, Rep. of Korea

[21] Appl. No.: 09/064,687

[22] Filed: Apr. 22, 1998

[30] Foreign Application Priority Data

Apr. 22, 1997 [KR] Rep. of Korea ............. 97-15004

[51] Int. Cl.[7] .................................................. H03K 17/00
[52] U.S. Cl. ........................ 327/99; 327/293; 327/294
[58] Field of Search ............................ 327/99, 291, 293, 327/294, 298, 403, 404

[56] References Cited

U.S. PATENT DOCUMENTS

| | | |
|---|---|---|
| 4,965,524 | 10/1990 | Patchen ............................ 327/99 |
| 5,336,939 | 8/1994 | Eitrheim et al. .................. 327/291 |
| 5,668,492 | 9/1997 | Pedersen et al. ................. 327/291 |
| 5,767,720 | 6/1998 | Osera et al. ..................... 327/295 |
| 5,850,150 | 12/1998 | Mitra et al. ..................... 326/16 |

*Primary Examiner*—Timothy P. Callahan
*Assistant Examiner*—Hai L. Nguyen
*Attorney, Agent, or Firm*—Marger Johnson & McCollom, P.C.

[57] ABSTRACT

A semiconductor memory device including an operation control circuit for selecting between a single data rate (SDR) mode and a double data rate (DDR) mode. The operation control circuit includes a mode selector for generating a master signal which selects between the SDR and the DDR mode. The operation control circuit also includes a shift register, a repeater, and a pulse generator. When the SDR mode is selected, the shift register generates an output clock signal which changes states every period of the input clock signal. When the DDR mode is selected, the repeater generates an output clock signal which changes states with every state change of the input clock signal. Productivity efficiency is enhanced and production costs are reduced by providing both the SDR and the DDR mode circuitry and the operation control circuit on a single chip.

20 Claims, 13 Drawing Sheets

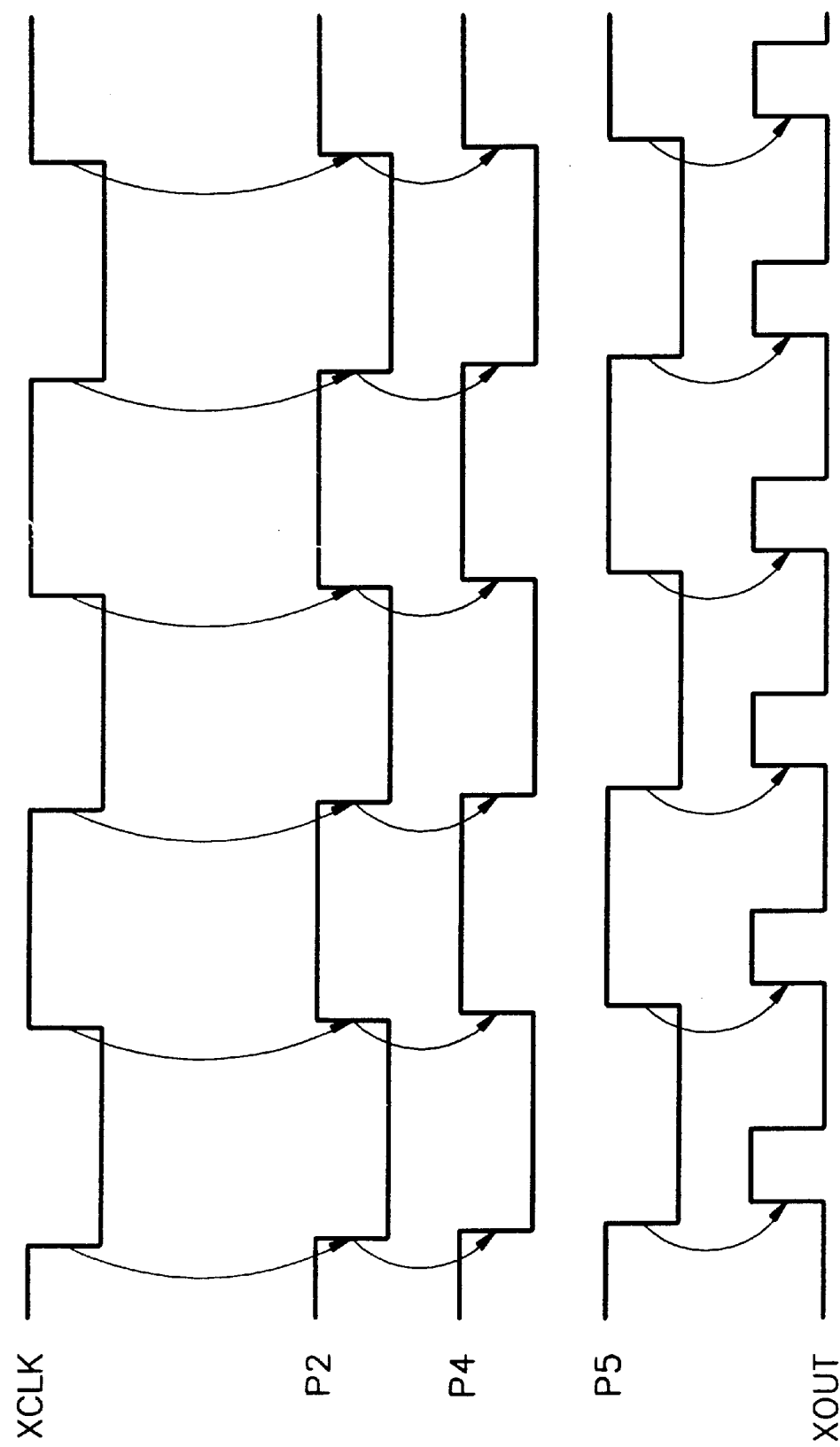

6,060,916

OPERATION CONTROLLER FOR A SEMICONDUCTOR MEMORY DEVICE

BACKGROUND OF THE INVENTION

1. Field of the Invention

The present invention relates to a semiconductor memory device, and more particularly, to an operation control circuit for a semiconductor memory device including a single data rate (SDR) mode and a double data rate (DDR) mode.

2. Description of the Related Art

In general, a computer system includes a central processing unit (CPU) for executing instructions and a main memory for storing the data and the program code required for CPU operation. Increasing the CPU operating speed improves the performance of the computer system. One way to increase the CPU operating speed is by eliminating the CPU waiting time thereby shortening the time required for accessing the main memory. Accordingly, a need remains for a Synchronous Dynamic Random Access Memory (SDRAM) operated under control of a system clock and having a short main memory accessing time.

In SDRAM devices control operations are typically responsive to pulse signals generated by the transition of a system clock. The method for generating a pulse signal responsive to the transition of the system clock can be divided into two modes: the SDR mode and the DDR mode. In the SDR mode, the pulse signal necessary to operate the SDRAM device is generated only during one directional transitions of the system clock, i.e., between a logic high to low transitions or a logic low to high transitions. In the DDR mode, the pulse signal necessary to operate the SDRAM device is generated during both directional transitions of the system clock, i.e., a logic high to low transitions and a logic low to high transitions.

Since data is input into or output from an SDRAM device on a rising or falling edge of a clock signal, the DDR mode is operable in a wide operational frequency range (bandwidth). Therefore, the DDR mode has the advantage of operating at very high speeds. However, the SDR mode has the advantage of a simple design. Typically, the DDR mode is used in memory devices for high speed systems and the SDR mode is used in all other memory devices.

FIG. 1 is a block diagram showing the operation controller of a conventional semiconductor memory device employing the SDR mode. FIG. 2 is a block diagram showing the operation controller of a conventional semiconductor memory device employing the DDR mode.

In memory devices using the DDR mode, signal set-up and hold times are defined for outputting data. These set-up and hold time are different for memory devices using the SDR mode. Accordingly, memory devices using the DDR mode and memory devices using the SDR mode are not interchangeable. Additionally, conventional semiconductor memory devices including operation control circuits which employ either SDR or DDR modes have no way of switching from one mode to another. Thus, production efficiency deteriorates and costs increase.

SUMMARY OF THE INVENTION

It is an object of the present invention to overcome the disadvantages associated with prior art operation control circuits for semiconductor memory devices.

It is another object of the present invention to provide a semiconductor memory device including an operation control circuit which has both a single data rate (SDR) mode and a double data rate (DDR) mode selectable in consideration of productivity efficiency and cost.

The present invention is directed to an operation control circuit which selects between the SDR and the DDR mode.

The operation control circuit for a semiconductor memory device includes a mode selector for generating a master signal having a single and a double data rate state and a first transmitter for generating a first transmitter clock signal by transmitting a clock signal responsive to the master signal in the single data rate state. The operation control circuit also includes a shift register for generating a shift register clock signal responsive to the first transmitter clock signal, the shift register clock signal changing states each period of the first transmitter clock signal and a second transmitter for generating a second transmitter clock signal by transmitting the clock signal responsive to the master signal in the double data rate state. A repeater for generates a repeater clock signal responsive to the second transmitter clock signal. The repeater clock signal changing states every time the second transmitter clock signal changes states. A third transmitter for generating an internal clock signal by transmitting the shift register output clock signal responsive to the master signal in the single data rate state is also included. A fourth transmitter generates the internal clock signal by transmitting the repeater output clock signal responsive to the master signal in the double data rate state and a pulse generator generates an output clock signal having a periodic pulse responsive to the internal clock signal.

BRIEF DESCRIPTION OF THE DRAWINGS

The above objects and advantages of the present invention will become more apparent by describing in detail a preferred embodiment thereof with reference to the attached drawings in which:

FIG. 15 is a timing diagram of the operation control circuit in the DDR mode according to the present invention.

DESCRIPTION OF THE PREFERRED EMBODIMENT

Figure 1:
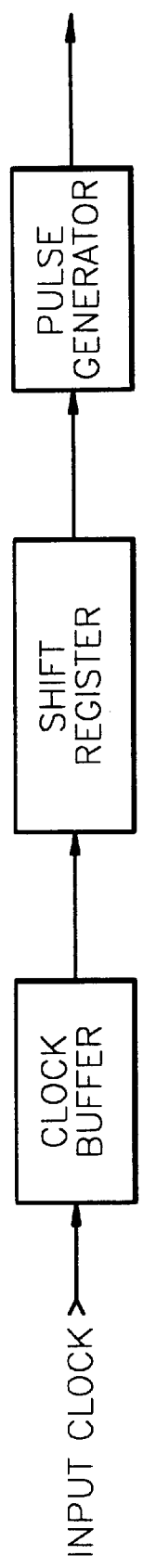
FIG. 1 is a block diagram of a conventional operation control circuit employing the SDR mode.
Figure 2:
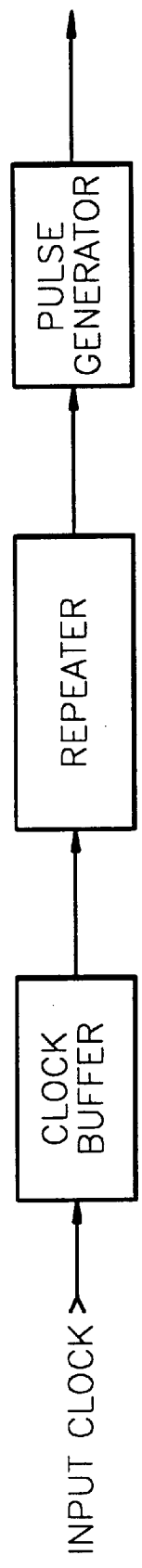
FIG. 2 is a block diagram of a conventional operation control circuit employing the DDR mode.

In the following detailed description, the same elements are assigned the same reference numerals and reference characters.

Figure 3:
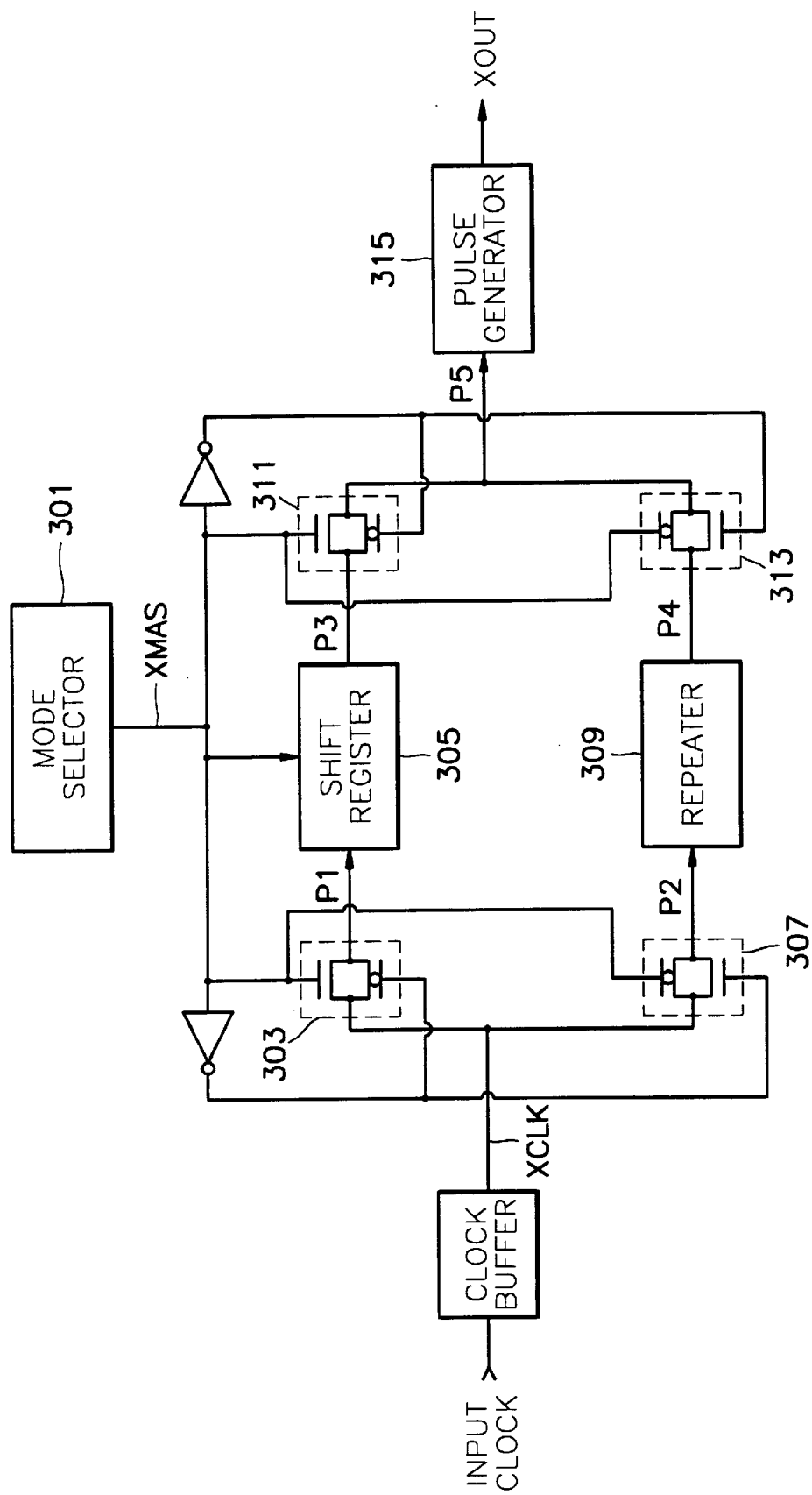
FIG. 3 is a block diagram of an embodiment of an operation control circuit for a semiconductor memory device according to the present invention.

Referring to FIG. 3, the operation control circuit according to the present invention includes a mode selector 301, a first transmission gate 303, a shift register 305, a second transmission gate 307, a repeater 309, a third transmission gate 311, a fourth transmission gate 313, and a pulse generator 315.

The mode selector 301 generates a master signal XMAS. During the single data rate (SDR) mode, the first transmitter 303 generates and transmits a predetermined clock signal XCLK responsive to the master signal XMAS. Also during the SDR mode, the shift register 305 changes the logic level of output signal P3 responsive to the clock signal XCLK transmitted through the first transmission gate 303.

During the double data rate (DDR) mode, the second transmitter 307 transmits the clock signal XCLK responsive to the master signal XMAS. Also during the DDR mode, the repeater 309, changes the logic level of output signal P4 responsive to the clock signal XCLK transmitted through the second transmission gate 307.

During the SDR mode, the third transmitter 311 transmits the output signal P3 of the shift register 305 to the pulse generator 315 responsive to the master signal XMAS. During the DDR mode, the fourth transmitter 313 transmits the output signal P4 of the register 309 to the pulse generator 315 responsive to the master signal XMAS.

The pulse generator 315 generates an output pulse XOUT when a signal P5 is received from either third or fourth transmitter 311 or 313.

In the present embodiment, the mode selector 301 generates master signal XMAS. The master signal XMAS selects between the SDR and the DDR mode by enabling either transmitters 303 and 311 or transmitters 307 and 313. For example, when master signal XMAS is at a logic 'high', the first and third transmitters 303 and 311 are turned on. At this time, the shift register 305 also operates. Thus, the signal P5 is transmitted responsive only to one directional transition of the clock signal XCLK. Accordingly, when the master signal XMAS is at a logic high, the XOUT pulse is generated in the SDR mode responsive to a one directional transition of the clock signal XCLK.

When the master signal XMAS is at a logic low the second and fourth transmitters 307 and 313 are turned on. At this time, repeater 309 also operates. Thus, a signal P5 is transmitted responsive to two directional transitions of the clock signal XCLK. Accordingly, when the master signal XMAS is at a logic low, the XOUT pulse is generated in the DDR mode responsive to two directional transitions of the clock signal XCLK.

Figure 4A:
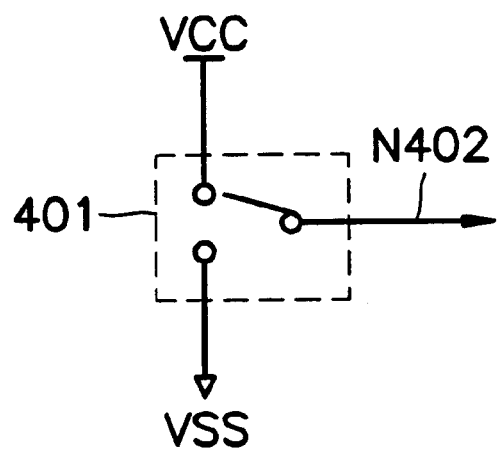
FIGS. 4A and 4B are schematic diagrams of mode selector 301 for the operation control circuit according to a preferred embodiment of the present invention.

FIG. 4A shows an embodiment of the mode selector 301 shown in FIG. 3. Referring to FIG. 4A, the mode selector 301 includes a switch 401 for switching between a power supply voltage VCC and a ground voltage VSS according to a photo mask to thereby generate the master signal XMAS at node N402. Thus, when the output node N402 of the mode selector is connected to a power supply voltage VCC the level of the master signal XMAS becomes a logic 'high' and the controller operates in the SDR mode. When the output node N402 of the mode selector is connected to ground voltage VSS, the level of the master signal XMAS becomes a logic 'low' and the controller operates in the DDR mode.

Figure 4B:
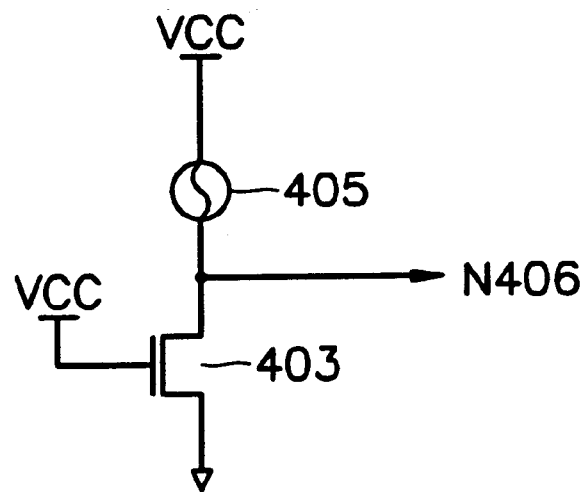

FIG. 4B shows another embodiment of the mode selector 301 shown in FIG. 3. Referring to FIG. 4B, the mode selector 301 includes an NMOS transistor 403 and a fuse 405. The NMOS transistor 403 includes a source connected to a ground voltage VSS and a gate connected to a power supply voltage VCC. The fuse 405 includes a first node connected to the power supply voltage VCC and a second node N406 connected to the drain of the NMOS transistor 403 to thereby generate the master signal XMAS.

When the fuse 405 is open, output node N406 is at ground voltage VSS according to the NMOS transistor 403. Therefore, the master signal XMAS is at a logic 'low' and the controller operates in the DDR mode. When the fuse 405 is closed, output node N406 is at power supply VCC. Thus, the master signal XMAS is at a logic 'high' and the controller operates in the SDR mode.

Figure 5:
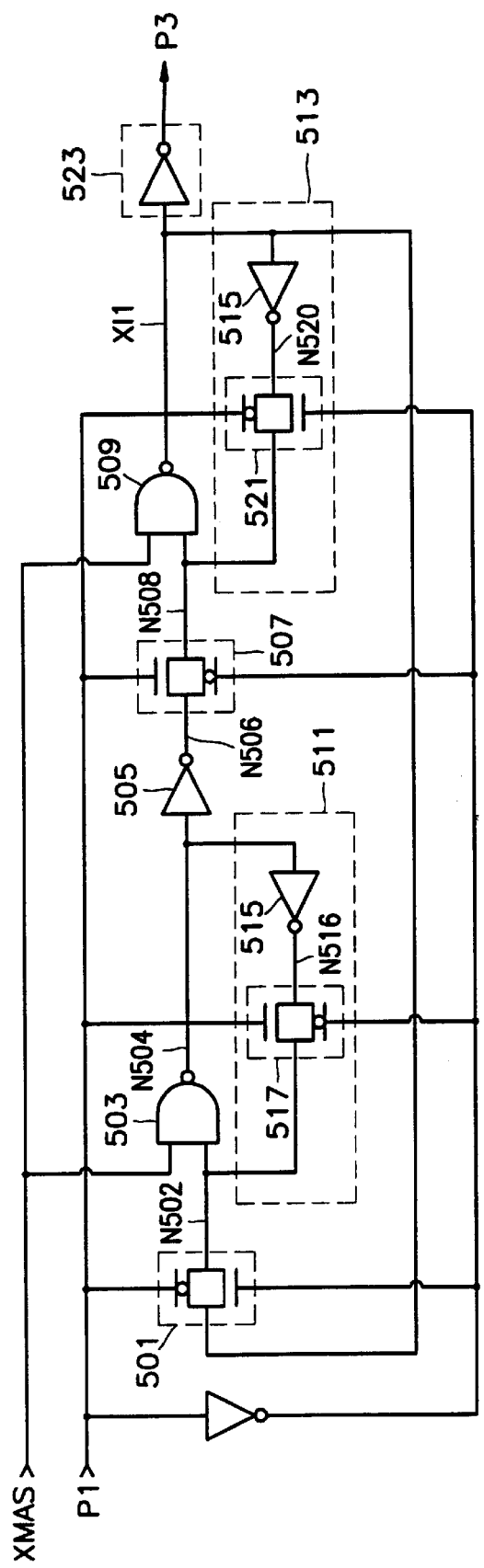
FIG. 5 is a schematic diagram of shift register 305 for the operation control circuit according to a first embodiment of the present invention.

FIG. 5 is a circuit diagram illustrating the shift register 305 shown in FIG. 3. The shift register 305 includes a fifth transmission gate 501, a first NAND gate 503, a first inverter 505, a sixth transmission gate 507, a second NAND gate 509, a first latch 511, and a second latch 513.

When the clock signal XCLK changes from a logic high to a logic low, the signal P1 also changes from a logic high to a logic low and the fifth transmission gate 501 transmits the internal signal XI1. The first NAND gate 503 is enabled in the SDR mode and responds to the internal signal XI1 transmitted through the fifth transmission gate 501.

The first inverter 505 inverts the output signal present at node N504 of the first NAND gate 503.

When the clock signal XCLK changes from a logic low to a logic high, the signal P1 also changes from a logic low to a logic high and the sixth transmission gate 507 transmits an output signal at node N506. The second NAND gate 509 is enabled in the DDR mode and generates the internal signal XI1 responsive to the output signal of the first inverter 505 transmitted through the sixth transmission gate 507.

When the signal P1 changes from a logic low to a logic high the first latch 511 latches an output signal at node N504 at the output of the first NAND gate 503.

When the signal P1 changes from a logic high to a logic low, the second latch 513 latches an output signal XI1 at the output of the NAND gate 503. The first latch 511 includes a second inverter 515 and an eighth transmission gate 517. The second inverter 515 inverts the output signal present at node N504 of the first NAND gate 503. The eighth transmission gate 517 transmits an output signal from N516 of the second inverter 515 to an input node N502 of the first NAND gate 503 responsive to a rising edge of the clock signal XCLK.

The second latch 513 includes a third inverter 515 and a seventh transmission gate 521. The third inverter 515 inverts the output signal XI1 of the second NAND gate 509. The seventh transmission gate 521 transmits an output signal from node N520 of the third inverter 515 to an input node N508 of the second NAND gate 509 responsive to a falling edge of the clock signal XCLK.

The shift register 305 further includes a buffer 523 for buffering the internal signal XI1 and generating an output signal P3 of the shift register 305.

Figure 6:
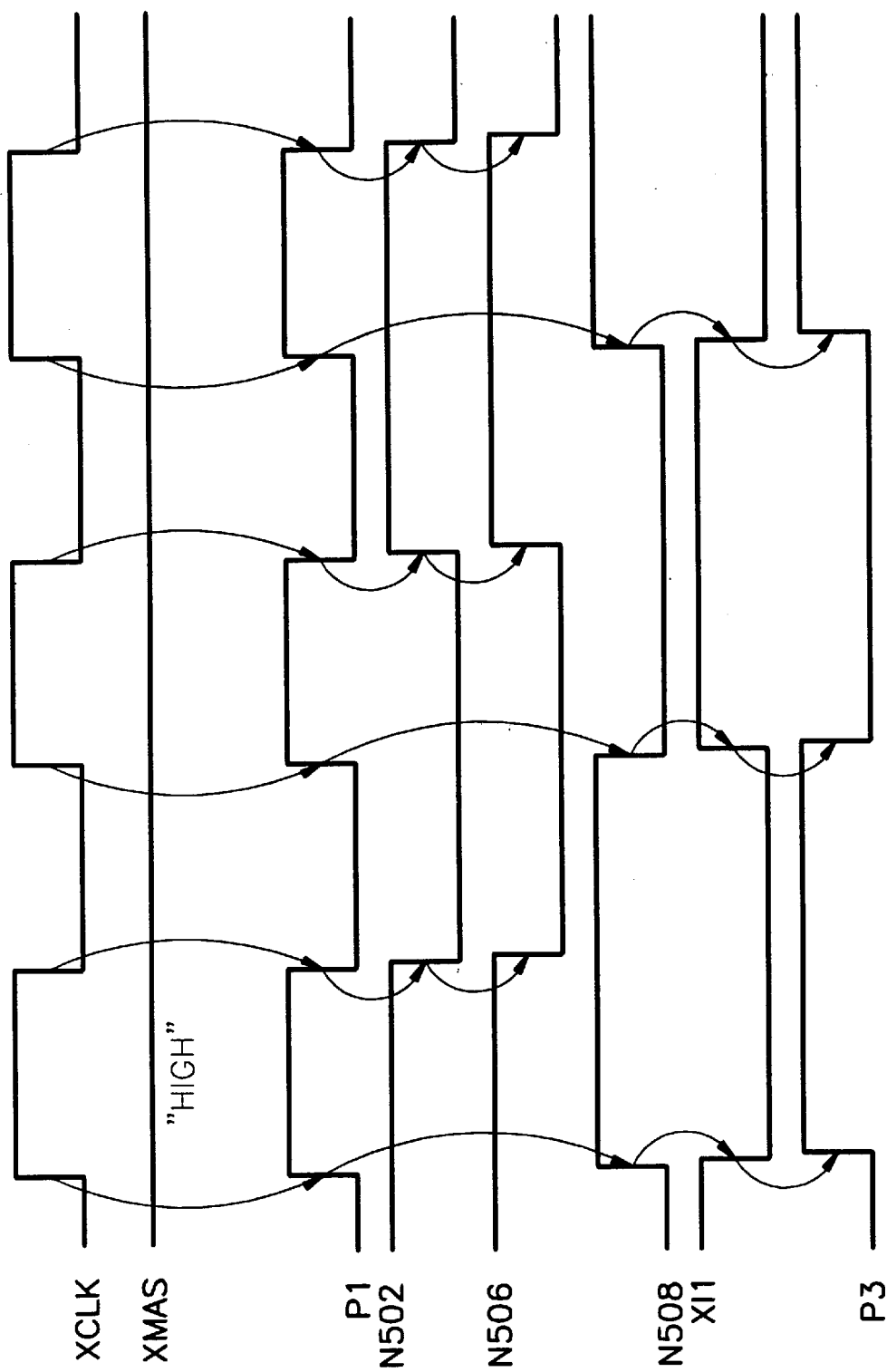
FIG. 6 is a timing diagram of the circuit shown in FIG. 5.

The operation of the first embodiment of the shift register 305 shown in FIG. 5 will be described in detail with reference to FIG. 6.

When the master signal XMAS is at a logic 'high', the shift register 305 is enabled. The clock signal XCLK is generated by buffering an externally input clock signal through a clock buffer. The clock signal XCLK is a pulse wave. The signal P1, which tracks the signal XCLK transmitted through the first transmission gate 301, is also a pulse wave.

Initially, the signal P1 is at a logic 'low' and the signal XI1 is at a logic 'high'. The signal at node N502 and node N506 are at a logic 'high' and the signal at node N508 is at a logic 'low'. Also, a level of an output signal P3 of the shift register is at a logic 'low'.

When the signal P1 changes to a logic 'high', the second transmission gate 507 is turned on and the fourth transmission gate 521 is turned off. Accordingly, the signal at the node N508 changes to a logic 'high'. As the signal at the node N508 changes to a logic 'high', the signal XI1 changes to a logic 'low'. Accordingly, signal P3 changes to a logic 'high'. As the first transmission gate 501 is turned off and the third transmission gate 517 is turned on, the signal at the node N502 is maintained at a logic 'high'.

When the signal P1 changes to a logic 'low' a second time, the first transmission gate 501 is turned on and the third transmission gate 517 is turned off. Therefore, the signal at the node N502 changes to a logic 'low'. As the signal at node N502 changes to a logic 'low', the signal at node N506 also changes to a logic 'low'. As the second transmission gate 507 is turned off and the fourth transmission gate 521 is turned on, the signal XI1 is maintained at a logic 'low'. Accordingly, the signal P3 is maintained at a logic 'high' state. Therefore, in the first embodiment of the shift register shown in FIG. 5, when the clock signal XCLK changes from a logic 'low' to a logic 'high', the signals XI1 and P3 indicate the SDR mode.

Figure 7:
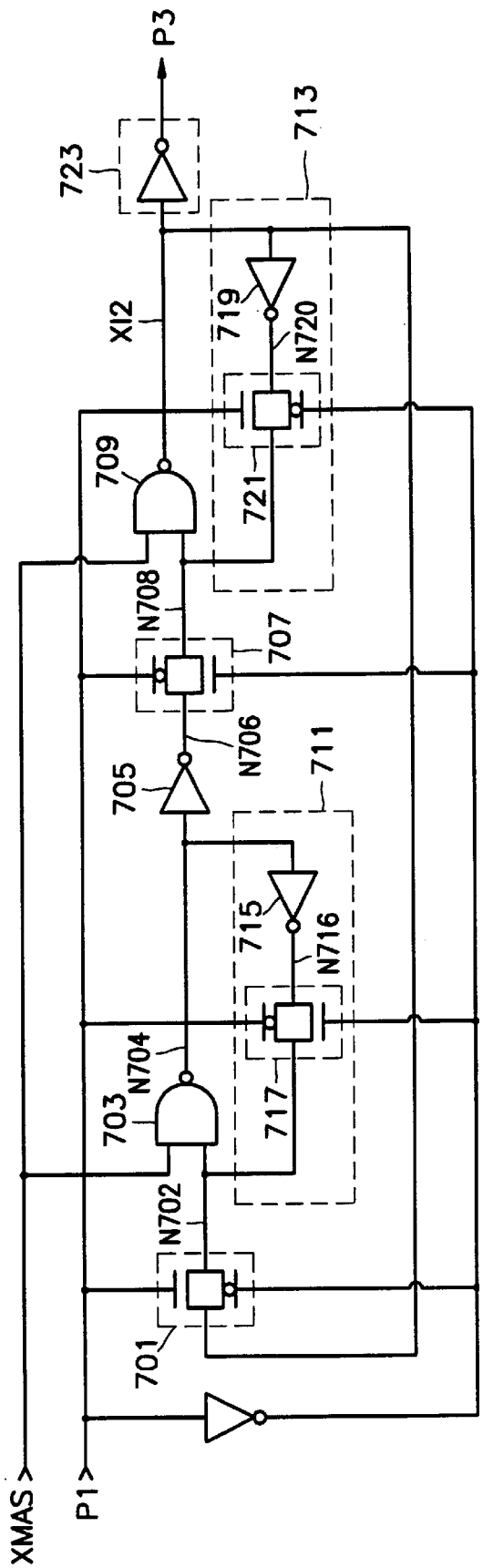
FIG. 7 is a schematic diagram of shift register 305 for the operation control circuit according to a second embodiment of the present invention.

Referring to FIG. 7, a second embodiment of shift register 305 includes a fifth transmission gate 701, a first NAND gate 703, a first inverter 705, a sixth transmission gate 707, a second NAND gate 709, a first latch 711, and a second latch 713.

When the clock signal XCLK changes from a logic 'low' to a logic 'high', the signal P1 also changes from a logic 'low' to a logic 'high' and the fifth transmission gate 701 transmits the internal signal XI1. The first NAND gate 703 is enabled in SDR mode and responds to the internal signal XI2 transmitted through the fifth transmission gate 701. The first inverter 705 inverts an output signal present at node N704 at the output of the first NAND gate 703.

When the clock signal XCLK, changes from a logic 'high' to a logic 'low', the signal P1 also changes from a logic 'high' to a logic 'low' and the sixth transmission gate 707 transmits an output signal to node N706 at the output of the first inverter 705. The second NAND gate 709 is enabled in the SDR mode and generates the internal signal XI2 responsive to the output signal of the first inverter 705 transmitted through the sixth transmission gate 707.

When the clock signal XCLK changes from a logic 'high' to a logic 'low', the first latch 711 latches an output signal at node N704 of the first NAND gate 709.

When the clock signal XCLK changes from a logic 'low' to a logic 'high', the signal P1 also changes from a logic 'low' to a logic 'high', and the second latch 713 latches an output signal XI2 at the output of the second NAND gate 703.

The first latch 711 includes a second inverter 715 and an eighth transmission gate 717. The second inverter 715 inverts the output signal present at node N504 of the first NAND gate 703. The eighth transmission gate 717 transmits the output signal at node N716 of the second inverter 715 to an input node N702 of the first NAND gate 703 responsive to the falling edge of the clock signal XCLK.

The second latch 713 includes a third inverter 719 and a seventh transmission gate 721. The third inverter 719 inverts an output signal XI2 of the second NAND gate 709. The seventh transmission gate 721 transmits an output signal from node N720 of the third inverter 719 to an input node N708 of the second NAND gate 709 responsive to the rising edge of the clock signal XCLK.

The shift register 305 includes a buffer 723 for buffering the internal signal XI2 and generating the output signal P3 of the shift register 305.

Figure 8:
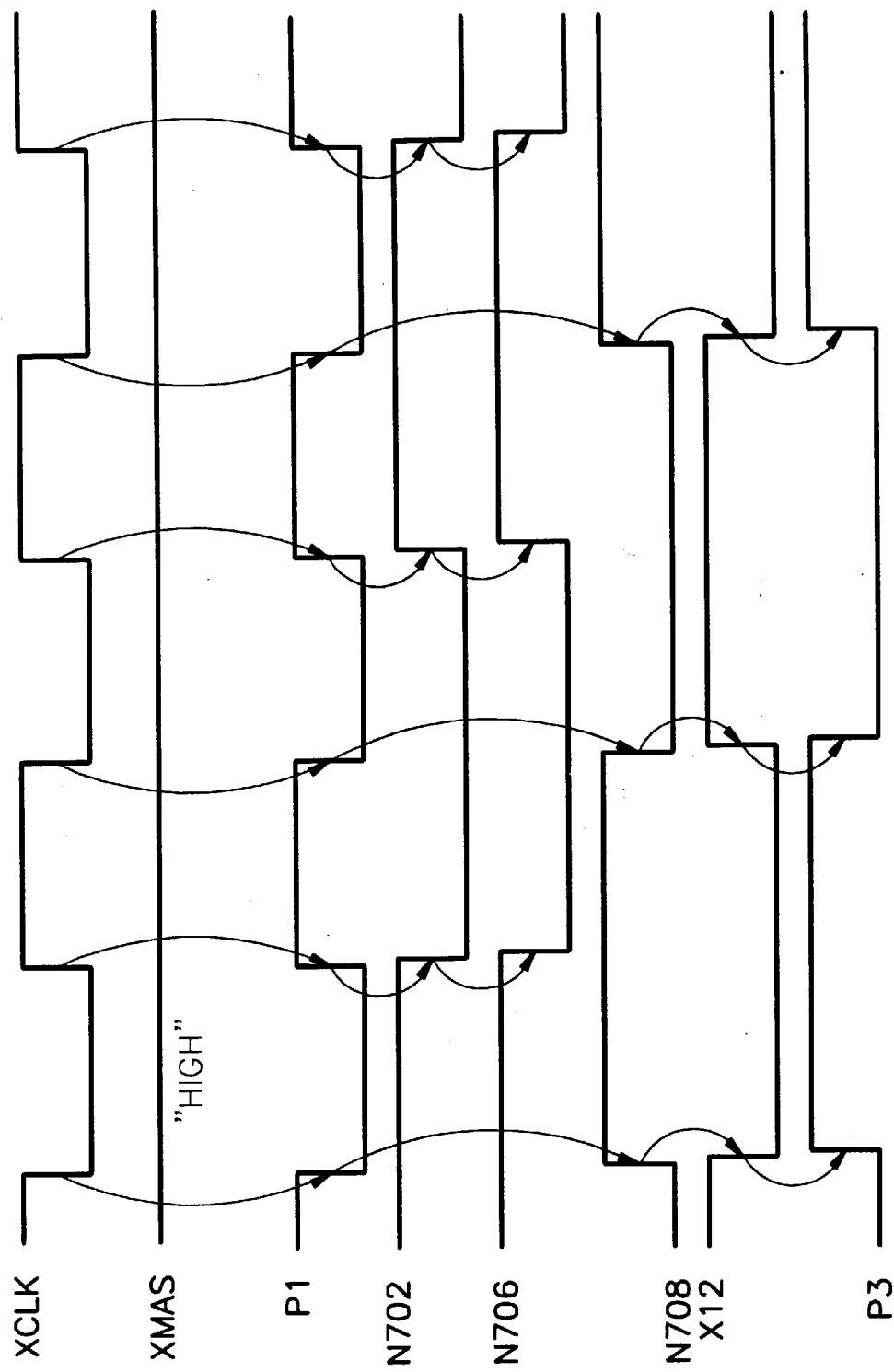
FIG. 8 is a timing diagram of the circuit shown in FIG. 7.

The operation of the second embodiment of the shift register shown in FIG. 7 will be described with reference to FIG. 8.

When the output signal XMAS is at a logic 'high', the shift register 305 is enabled. The clock signal XCLK is generated by buffering an externally input clock signal through a clock buffer. The clock signal XCLK is a pulse wave. The signal P1, which tracks the clock signal XCLK transmitted through the first transmission gate 701, is also a pulse wave.

Initially, the signals P1 and XI1 are at a logic 'high'. The signals present at nodes N702 and N706 are at a logic 'high' and the signal present at node N708 is at a logic 'low'. Thus, output signal P3 of the shift register is at a logic 'low'.

When the signal P1 changes from a logic 'high' to a logic 'low', the second transmission gate 707 is turned on and the fourth transmission gate 721 is turned off. The signal present at node N708 changes to a logic 'high' with the transmission of the signal present at node N706. As the signal at node N708 changes to a logic 'high', internal signal XI2 changes to a logic 'low'. Accordingly, signal P3 changes to a logic 'high'. As the first transmission gate 701 is turned off and the third transmission gate 717 is turned on, the signal present at node N702 is maintained at a logic 'high'.

When the signal P1 changes to a logic 'high' again, the fifth transmission gate 701 is turned on and the sixth transmission gate 717 is turned off. Therefore, the signal at node N702 changes to a logic 'low'. As the signal present at node N702 changes to a logic 'low', the signal at node N706 also changes to a logic 'low'. As the sixth transmission gate 707 is turned off and the seventh transmission gate 721 is turned on, the signal XI2 is maintained at a logic 'low'. Accordingly, the signal P3 is maintained at a logic 'high' state. Therefore, in the second embodiment of the shift register shown in FIG. 7, signals XI2 and P3 change logic states only when the clock signal XCLK changes from a logic 'high' to a logic 'low' indicative of the SDR mode.

Figure 9:
FIG. 9 is a schematic diagram of repeater 309 for the operation control circuit according to a preferred embodiment of the present invention.

Referring to FIG. 9, the repeater 309 includes a buffer for buffering the clock signal P2 transmitted through the second transmission gate 307 and generating the repeater output signal P4.

Figure 10:
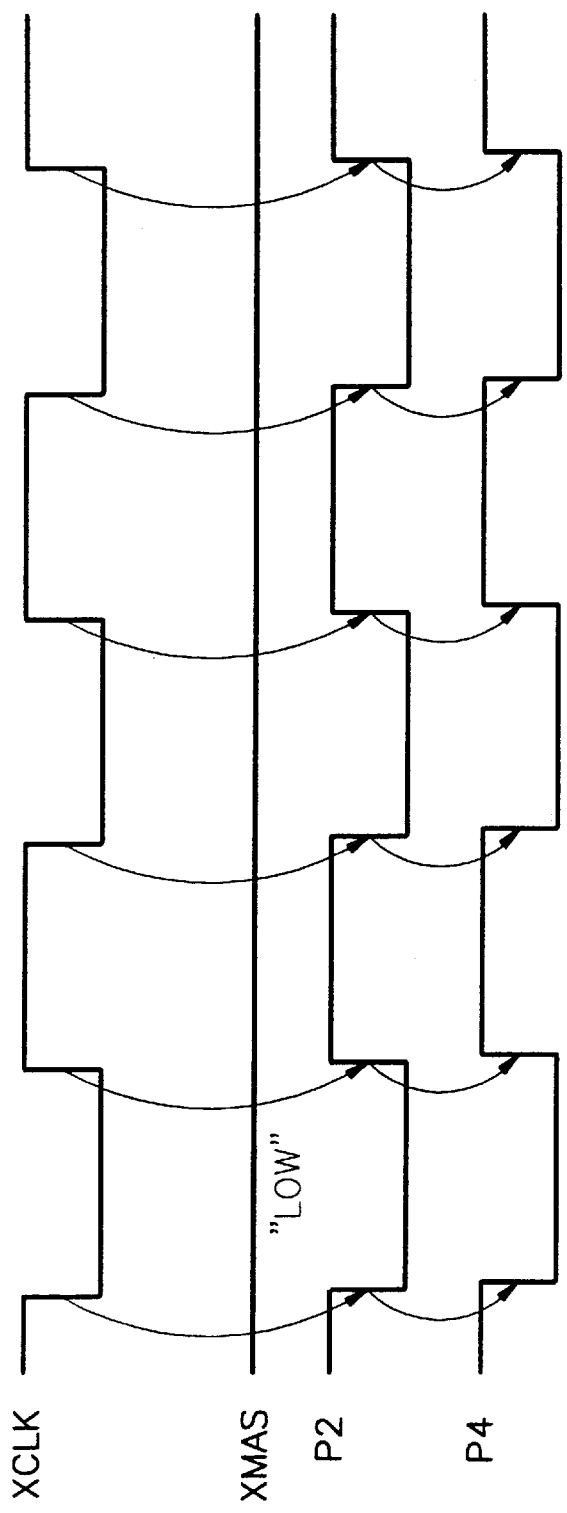
FIG. 10 is a timing diagram of the circuit shown in FIG. 9.

Referring to FIG. 10, when the output signal XMAS is at a logic 'low', the second transmission gate 307 is turned on thereby providing the clock signal XCLK to the signal P2. The repeater buffers the signal P2 to generate the repeater output signal P4. Accordingly, the repeater 309 shown in FIG. 9 changes the logic state of signal P4 when the clock signal changes from a logic 'high' to a logic 'low' and from a logic 'low' to a logic 'high'.

Figure 11:
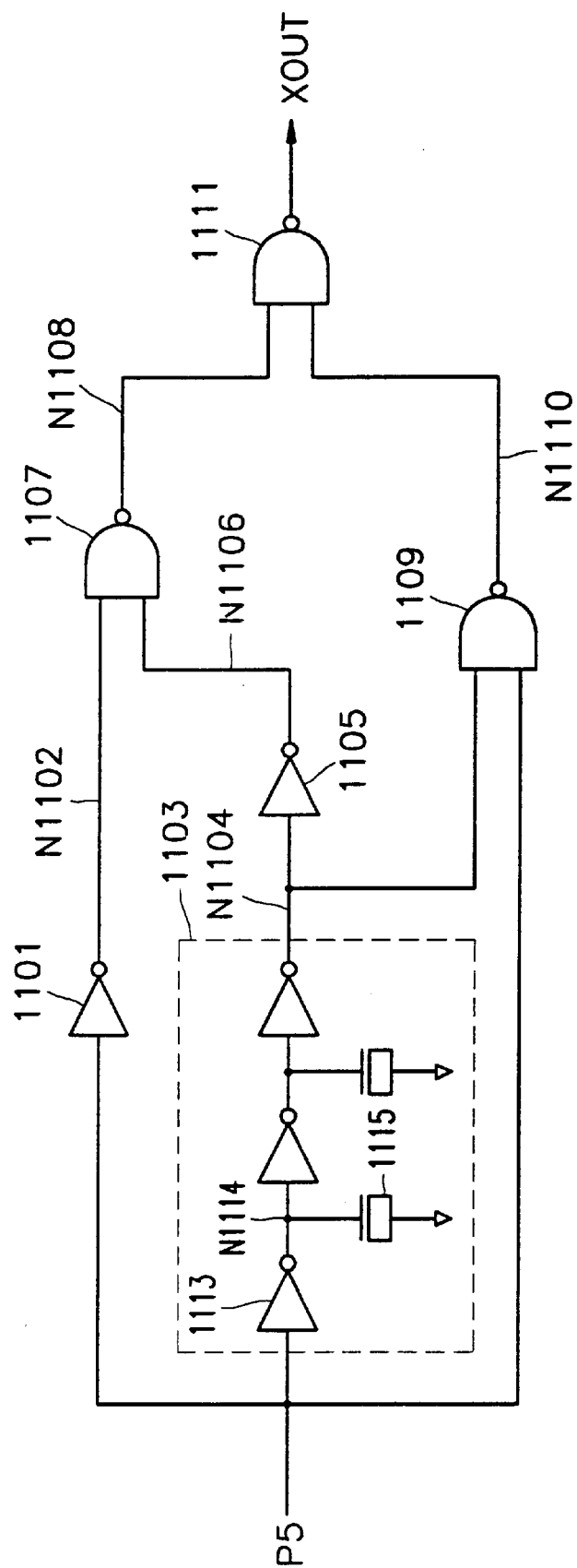
FIG. 11 is a schematic diagram of pulse generator 315 for the operation control circuit according to a preferred embodiment of the present invention.

Referring to FIG. 11, the pulse generator 315 includes a first inverter 1101, an inversion delay 1103, a second inverter 1105, a first NAND gate 1107, a second NAND gate 1109, and a third NAND gate 1111.

The first inverter 1101 inverts the signal P5. The inverter delay 1103 inverts and delays the signal P5. The second inverter 1105 inverts the output signal present at node N1104 of the inversion delay 1103.

The first NAND gate 1107 logically-NANDs the output signal at node N1102 of the first inverter 1101 and the output signal at node N1106 of the second inverter 1105. The second NAND gate 1109 logically-NANDs the signal P5 and the output signal at node N1104 of the inversion delay 1103.

The third NAND gate 1111 logically-NANDs the output signal at node N1108 of the first NAND gate 1107 and the output signal at node N1110 of the second NAND gate 1109.

The inversion delay 1103 includes an inverter 1103 for inverting the signal P5 and a capacitor 1115 formed between either a power supply voltage VCC or a ground voltage VSS and the output node N1114 of the inversion delay 1103.

In the present embodiment, the capacitor 1115 includes an NMOS transistor having a source and a drain commonly connected to the ground voltage VSS and a gate connected to the output node N1114 of the inversion delay 1103.

Figure 12:
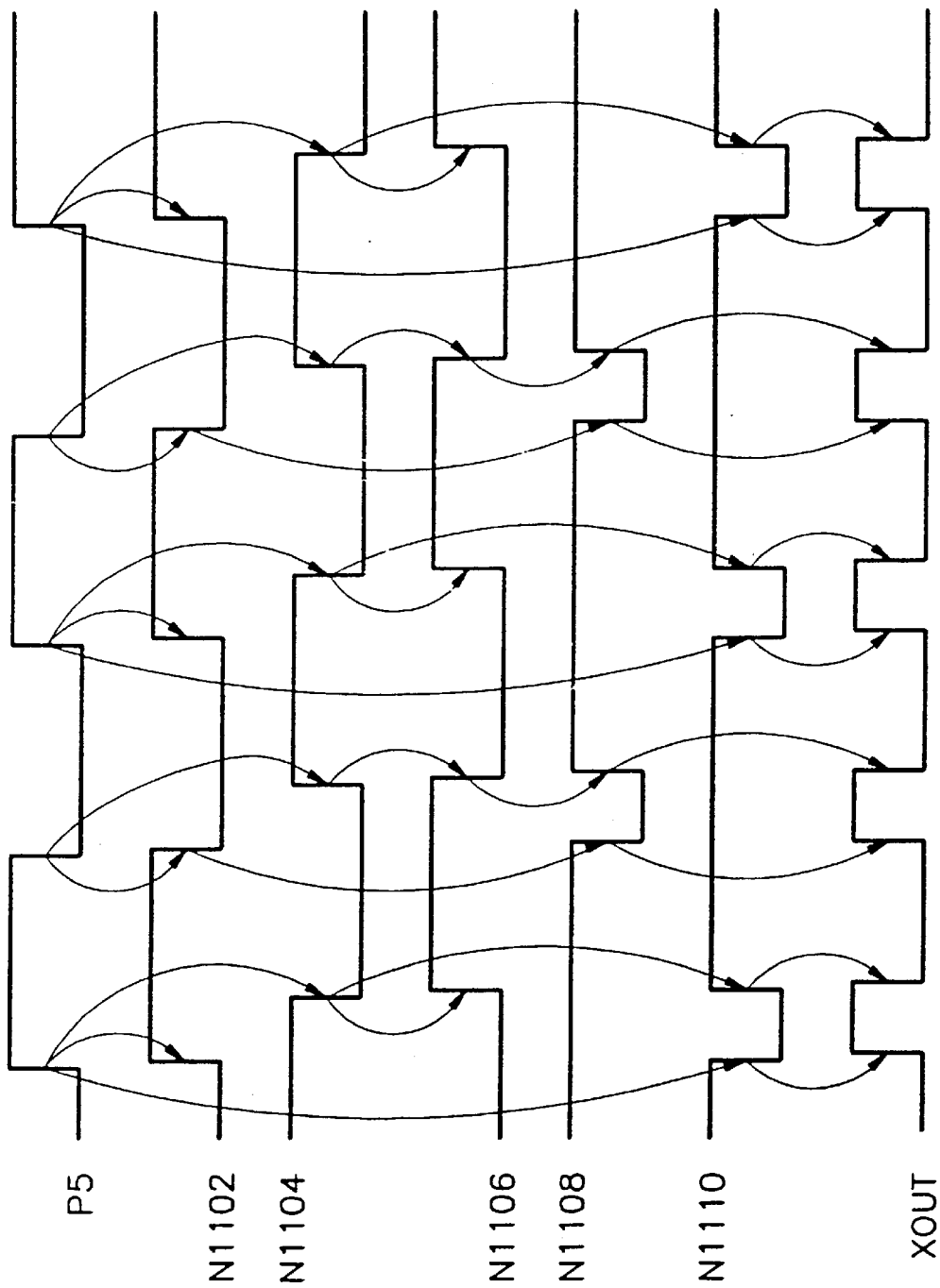
FIG. 12 is a timing diagram of the circuit shown in FIG. 11.

Referring to FIG. 12, whenever the signal P5 changes logic states, the pulse generator 315 generates the signal XOUT having a pulse waveform.

Figure 13:
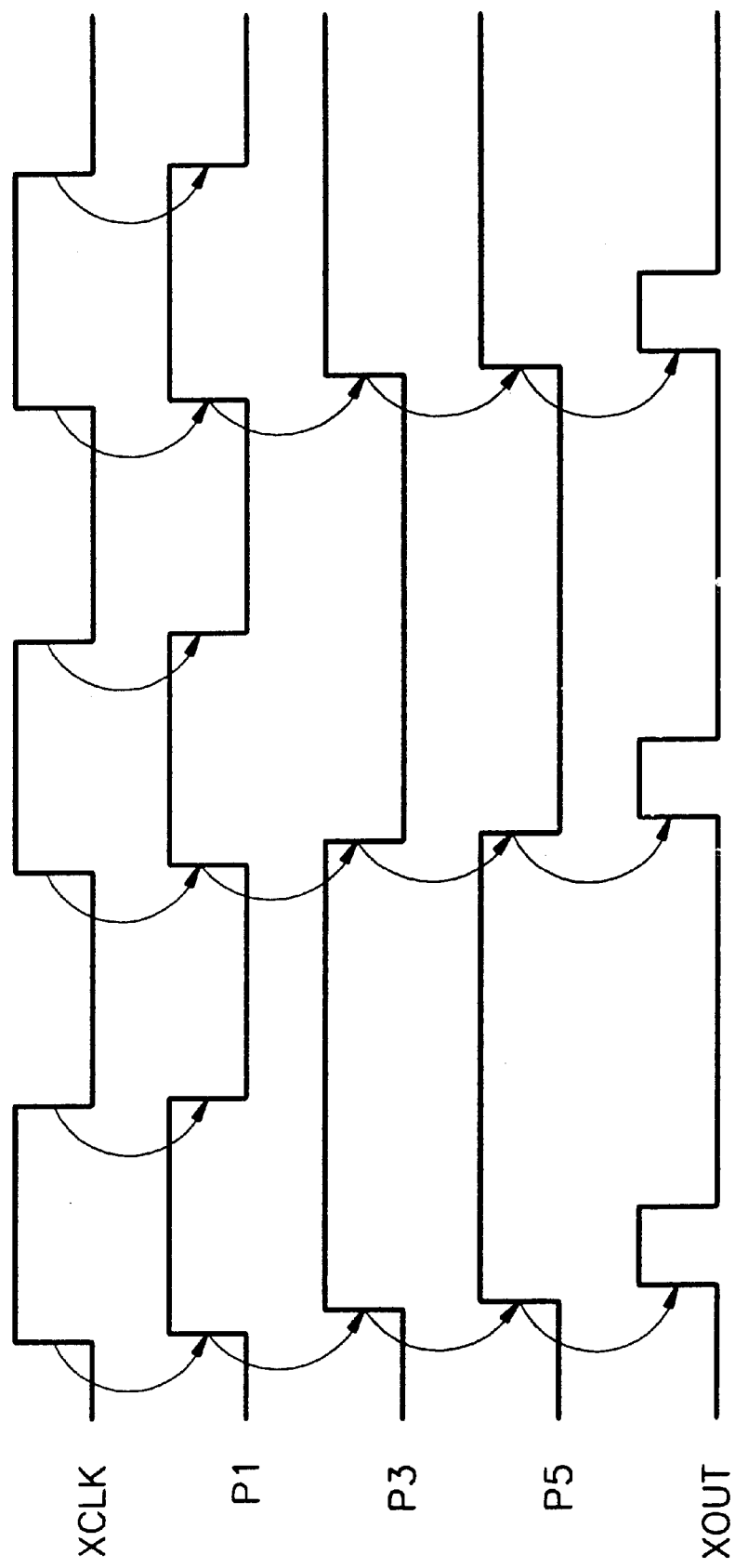
FIG. 13 is a timing diagram of the operation control circuit in the SDR mode including a shift register according to the first embodiment of the present invention.

Referring to FIG. 13, whenever the externally input clock XCLK changes from a logic 'low' to a logic 'high', the operation controller generates a pulse of the output signal XOUT.

Figure 14:
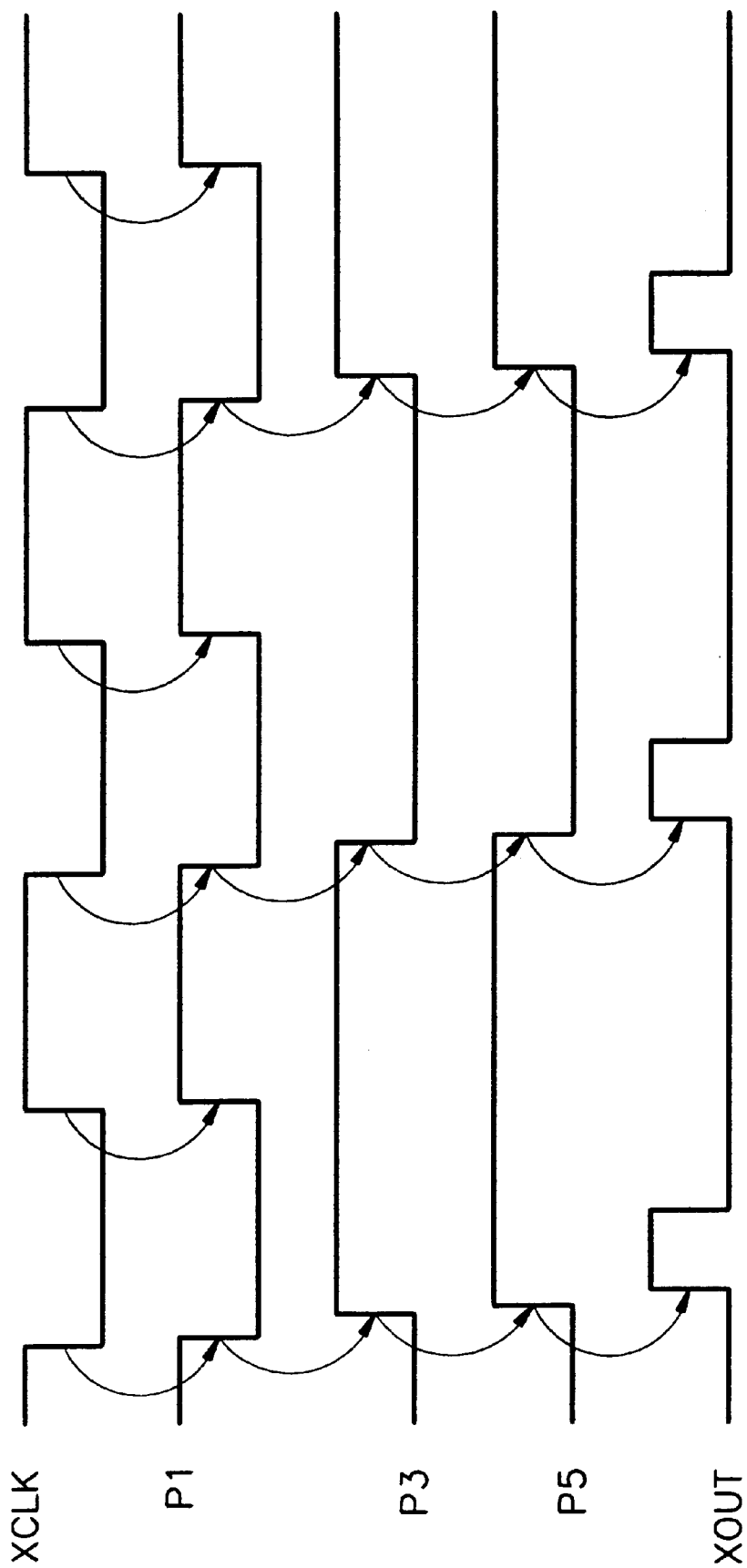
FIG. 14 is a timing diagram of the operation control circuit in the SDR mode including a shift register according to the second embodiment of the present invention.

Referring to FIG. 14, whenever the externally input clock signal XCLK changes from a logic 'high' to a logic 'low', the operation controller generates a pulse of the output signal XOUT.

Referring to FIG. 15, whenever the externally input clock signal XCLK changes from either a logic 'high' to a logic 'low' or from a logic 'low' to a logic 'high', the operation controller generates a pulse of the output signal XOUT.

As described above, the operation control circuit for a semiconductor memory device according to the present invention includes circuitry for selecting between SDR and DDR mode circuitry thereby enhancing productivity efficiency and reducing production costs.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. An operation control circuit for a semiconductor memory device, comprising:
   a mode selector for generating a master signal having a single and a double data rate state;
   a first transmitter for outputting a first transmitter clock signal by transmitting a clock signal responsive to the master signal in the single data rate state;
   a shift register for receiving the first transmitter clock signal and outputting a shift register clock signal responsive to the first transmitter clock signal and the master signal, the shift register clock signal changing states each period of the first transmitter clock signal;
   a second transmitter for outputting a second transmitter clock signal by transmitting the clock signal responsive to the master signal in the double data rate state;
   a repeater for receiving the second transmitter clock signal and outputting a repeater clock signal responsive to the second transmitter clock signal, the repeater clock signal changing states every time the second transmitter clock signal changes states;
   a third transmitter for outputting a first internal clock signal by transmitting the shift register output clock signal responsive to the master signal in the single data rate state;
   a fourth transmitter for outputting a second internal clock signal by transmitting the repeater output clock signal responsive to the master signal in the double data rate state; and
   a pulse generator for receiving the first or second internal clock signals responsive to the master signal and generating an output clock signal having a periodic pulse responsive to the first or second internal clock signals.

2. The operation control circuit of claim 1 wherein the mode selector comprises a switch for selecting either a power supply voltage or ground.

3. An operation control circuit for a semiconductor memory device, comprising:
   a mode selector for generating a master signal having a single and a double data rate state;
   a first transmitter for outputting a first transmitter clock signal by transmitting a clock signal responsive to the master signal in the single data rate state;
   a shift register for outputting a shift register clock signal responsive to the first transmitter clock signal, the shift register clock signal changing states each period of the first transmitter clock signal;
   a second transmitter for outputting a second transmitter clock signal by transmitting the clock signal responsive to the master signal in the double data rate state;
   a repeater for outputting a repeater clock signal responsive to the second transmitter clock signal, the repeater clock signal changing states every time the second transmitter clock signal changes states;
   a third transmitter for outputting a first internal clock signal by transmitting the shift register output clock signal responsive to the master signal in the single data rate state;
   a fourth transmitter for outputting a second internal clock signal by transmitting the repeater output clock signal responsive to the master signal in the double data rate state; and
   a pulse generator for outputting an output clock signal having a periodic pulse responsive to the first or second internal clock signals;
   wherein the mode selector comprises:
      an NMOS transistor having a gate, a source, and a drain, the source being connected to ground and the gate being connected to a power supply voltage; and
      a fuse having a first node connected to the power supply voltage and a second node connected to the drain of the NMOS transistor.

4. An operation control circuit for a semiconductor memory device, comprising:
   a mode selector for generating a master signal having a single and a double data rate state;
   a first transmitter for outputting a first transmitter clock signal by transmitting a clock signal responsive to the master signal in the single data rate state;
   a shift register for outputting a shift register clock signal responsive to the first transmitter clock signal, the shift register clock signal changing states each period of the first transmitter clock signal;

a second transmitter for outputting a second transmitter clock signal by transmitting the clock signal responsive to the master signal in the double data rate state;

a repeater for outputting a repeater clock signal responsive to the second transmitter clock signal, the repeater clock signal changing states every time the second transmitter clock signal changes states;

a third transmitter for outputting a first internal clock signal by transmitting the shift register output clock signal responsive to the master signal in the single data rate state;

a fourth transmitter for outputting a second internal clock signal by transmitting the repeater output clock signal responsive to the master signal in the double data rate state; and a pulse generator for outputting an output clock signal having a periodic pulse responsive to the first or second internal clock signals;

wherein the shift register comprises:
  a fifth transmitter for transmitting an internal shift register periodic signal responsive to a first state of the first transmitter clock signal;
  a first NAND gate for logically-NANDing the internal shift register periodic signal to the master signal;
  a first inverter for receiving and inverting a signal output from the first NAND gate;
  a sixth transmitter for transmitting a signal output from the first inverter responsive to a second state of the first transmitter clock signal;
  a second NAND gate for outputting the internal shift register periodic signal by logically-NANDing a signal output from the sixth transmission gate and the master signal;
  a first latch for latching the signal output from the first NAND gate responsive to the second state of the first transmitter clock signal; and
  a second latch for latching the internal shift register periodic signal responsive to the first state of the first transmitter clock signal.

5. The operation control circuit of claim 4 wherein the first latch comprises:
  a second inverter for inverting the signal output from the first NAND gate; and
  a seventh transmitter for transmitting a signal output from the second inverter responsive to the second state of the first transmitter clock signal.

6. The operation control circuit of claim 4 wherein the second latch comprises:
  a second inverter for inverting the signal output from the second NAND gate; and
  a seventh transmitter gate for transmitting the signal output from the second inverter responsive to the first state of the first transmitter clock signal.

7. The operation control circuit of claim 4 wherein the first state of the first transmitter clock signal is a logic low and the second state of the first transmitter clock signal is a logic high.

8. The operation control circuit of claim 1 wherein the repeater further comprises a buffer for outputting the repeater clock signal by buffering the second transmitter clock signal.

9. An operation control circuit for a semiconductor memory device, comprising:

a mode selector for generating a master signal having a single and a double data rate state;

a first transmitter for outputting a first transmitter clock signal by transmitting a clock signal responsive to the master signal in the single data rate state;

a shift register for outputting a shift register clock signal responsive to the first transmitter clock signal, the shift register clock signal changing states each period of the first transmitter clock signal;

a second transmitter for outputting a second transmitter clock signal by transmitting the clock signal responsive to the master signal in the double data rate state;

a repeater for outputting a repeater clock signal responsive to the second transmitter clock signal, the repeater clock signal changing states every time the second transmitter clock signal changes states;

a third transmitter for outputting a first internal clock signal by transmitting the shift register output clock signal responsive to the master signal in the single data rate state;

a fourth transmitter for outputting a second internal clock signal by transmitting the repeater output clock signal responsive to the master signal in the double data rate state; and a pulse generator for outputting an output clock signal having a periodic pulse responsive to the first or second internal clock signals;

wherein the pulse generator comprises:
  a first inverter for outputting a first inverter signal by inverting the first or second internal clock signals responsive to the master signal;
  an inversion delay for outputting an inversion delay signal by inverting and delaying either the third or fourth transmitter clock signal responsive to the master signal;
  a second inverter for outputting a second inverter signal by inverting the inversion delay signal;
  a first NAND gate for outputting a first NAND gate signal by logically-NANDing the first inverter signal with the second inverter signal;
  a second NAND gate for outputting a second NAND gate signal by logically-NANDing the inversion delay signal with either the third or fourth transmitter clock signal; and
  a third NAND gate for logically-NANDing the first NAND gate signal with the second NAND gate signal.

10. The operation control circuit of claim 9 wherein the inversion delay comprises:
  a third inverter for inverting either the third or fourth transmitter clock signal; and
  a capacitor formed between an output node of the third inverter and either a power supply voltage or a ground voltage.

11. A control circuit for a synchronous dynamic random access memory device, comprising:

a mode selector for generating a master signal having a first and a second logic states;

a single data rate signal path having a first output terminal for outputting a single data rate clock signal responsive to the master signal being in the first logic state;

a double data rate signal path having a second output terminal for outputting a double data rate clock signal responsive to the master signal being in the second logic state; and a pulse generator having an input terminal coupled to the first and second output terminals for receiving the single or double data rate clock signals responsive to the master signal, the pulse generator generating a periodic pulse signal.

12. The control circuit of claim 11 wherein the single data rate signal path includes:
   a first transmitter for outputting a first transmitter clock signal by transmitting a clock signal responsive to the master signal being in the first state;
   a shift register for outputting a shift register clock signal responsive to the first transmitter clock signal and the master signal; and
   a second transmitter for outputting an internal clock signal by transmitting the shift register clock signal responsive to the master signal being in the first state.

13. A control circuit for a synchronous dynamic random access memory device, comprising:
   a mode selector for generating a master signal having a first and a second logic states;
   a single data rate signal path for outputting a single data rate clock signal responsive to the master signal being in the first logic state; and
   a double data rate signal path for outputting a double data rate clock signal responsive to the master signal being in the second logic state;
   wherein the single data rate signal path includes:
      a first transmitter for outputting a first transmitter clock signal by transmitting a clock signal responsive to the master signal being in the first state;
      a shift register for outputting a shift register clock signal responsive to the first transmitter clock signal and the master signal; and
      a second transmitter for outputting an internal clock signal by transmitting the shift register clock signal responsive to the master signal being in the first state; and
      wherein the shift register includes:
         a third transmitter for transmitting an internal shift register clock signal;
         a first NAND gate for gating the internal shift register clock signal with the master signal;
         a first latch for latching an output signal from the first NAND gate responsive to the first transmitter clock signal;
         a fourth transmitter for transmitting the signal output from the first NAND gate responsive to the first transmitter clock signal; and
         a second latch for latching the internal shift register clock signal responsive to the first transmitter clock signal.

14. The control circuit of claim 12 wherein the double data rate signal path includes:
   a first transmitter for outputting a first transmitter clock signal responsive to the master signal being in a second state;
   a repeater for buffering the first transmitter clock signal; and
   a second transmitter for outputting an internal clock signal by transmitting the buffered first transmitter signal responsive to the master signal being in a second state.

15. The control circuit of claim 14 wherein the repeater includes two serially connected inverters.

16. A control circuit for a synchronous dynamic random access memory device, comprising:

a mode selector for generating a master signal having a first and a second logic states;
a single data rate signal path for outputting a single data rate clock signal responsive to the master signal being in the first logic state;
a double data rate signal path for outputting a double data rate clock signal responsive to the master signal being in the second logic state; and
a pulse generator for receiving the single or double data rate clock signals and generating a periodic pulse signal;
wherein the pulse generator includes:
   an inversion delay for receiving the single or double data rate clock signal and generating an inversion delay clock signal;
   a first inverter for inverting the single or double data rate clock signal;
   a second inverter for inverting the inversion delay clock signal;
   a first NAND gate for gating the inverted internal clock signal with the inverted inversion delay clock signal;
   a second NAND gate for gating the inverted internal clock signal with the inversion delay clock signal; and
   a third NAND gate for outputting the periodic pulse signal by gating an output signal from the first NAND gate with an output signal from the second NAND gate.

17. A method for generating a periodic pulse signal in a semiconductor memory device, the method comprising:
   generating a master signal having a single data rate state and a double data rate state;
   generating a single data rate clock signal responsive to the master signal being in the single data rate state, the single data rate clock signal changing states every period of an input clock signal;
   generating a double data rate clock signal responsive to the master signal being in a double data rate state, the double data rate clock signal changing states every state change of the input clock signal; and
   generating a periodic pulse signal from either the single data rate clock signal or the double data rate clock signal responsive to the master signal.

18. The method of claim 17 including buffering the input clock signal.

19. The method of claim 17 wherein generating the single data rate clock signal includes:
   generating a first clock signal by transmitting the input clock signal to a first node responsive to the master signal;
   generating a shift register clock signal responsive to the master signal; and
   generating a second clock signal by transmitting the shift register clock signal to a second node responsive to the master signal.

20. A method for generating a periodic pulse signal in a semiconductor memory device, the method comprising:
   generating a master signal having a single data rate state and a double data rate state;
   generating a single data rate clock signal responsive to the master signal being in the single data rate state, the single data rate clock signal changing states every period of an input clock signal;
   generating a double data rate clock signal responsive to the master signal being in a double data rate state, the double data rate clock signal changing states every state change of the input clock signal; and generating a periodic pulse signal from either the single data rate clock signal or the double data rate clock signal responsive to the master signal;

wherein generating the single data rate clock signal includes:

generating a first clock signal by transmitting the input clock signal to a first node responsive to the master signal;

generating a shift register clock signal responsive to the master signal; and generating a second clock signal by transmitting the shift register clock signal to a second node responsive to the master signal; and wherein generating the shift register clock signal includes:

generating a third clock signal by transmitting an internal clock signal to a third node responsive to the first clock signal;

generating a first gate signal by gating the master signal to the third clock signal;

latching the first gate signal responsive to the first clock signal;

inverting the latched first gate signal;

generating the fourth clock signal by transmitting the inverted latched first gate signal to a fourth node responsive to the first clock signal;

gating the fourth clock signal with the master signal thereby generating the internal clock signal;

latching the internal clock signal responsive to the first clock signal; and generating the shift register clock signal by buffering the latched internal clock signal.

* * * * *